(12) United States Patent
Estacio et al.

(10) Patent No.: US 6,649,961 B2
(45) Date of Patent: Nov. 18, 2003

(54) SUPPORTING GATE CONTACTS OVER SOURCE REGION ON MOSFET DEVICES

(75) Inventors: Maria Cristina B. Estacio, Cebu City (PH); R. Evan Bendal, Centerville, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 4 days.

(21) Appl. No.: 10/117,890

(22) Filed: Apr. 8, 2002

(65) Prior Publication Data

US 2003/0189248 A1 Oct. 9, 2003

(51) Int. Cl.$^7$ .............................................. H01L 29/72
(52) U.S. Cl. ........................ 257/296; 257/401; 257/673; 257/692; 257/738; 257/773
(58) Field of Search .............................. 257/296, 673, 257/692, 738, 773, 401

(56) References Cited

U.S. PATENT DOCUMENTS

2001/0045635 A1 * 11/2001 Kizner et al. ................ 257/685

* cited by examiner

Primary Examiner—Edward Wojciechowicz
(74) Attorney, Agent, or Firm—Thomas R. FitzGerald, Esq.

(57) ABSTRACT

Increasing the number of MOSFET gate bump contacts makes MOSFET gate contacts more durable and reliable. Extension of the under-bump metal laterally from the gate contact with the gate pad metallization out to two or more gate pads overlying the source pad metallization reduces the risk of delamination of the metallization due to thermal and mechanical stresses in assembly and operation. Use of more than one gate pad further reduces such failure risks. The result is a reliable, durable MOSFET gate contact.

46 Claims, 21 Drawing Sheets

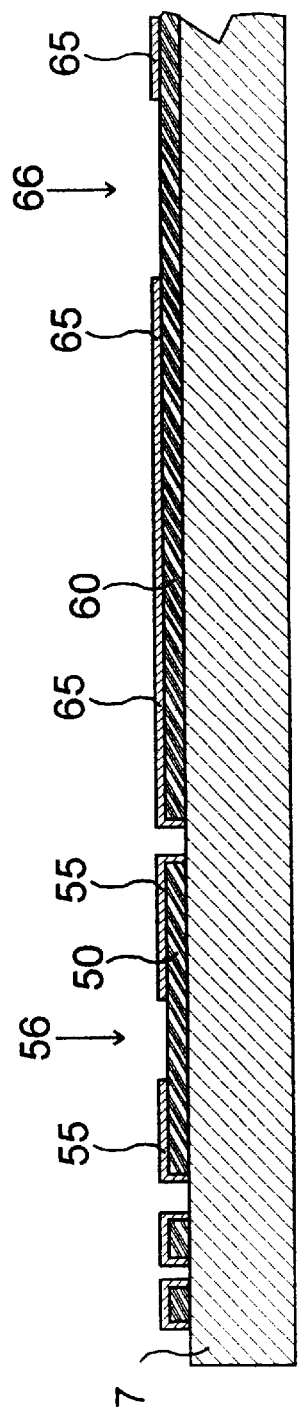
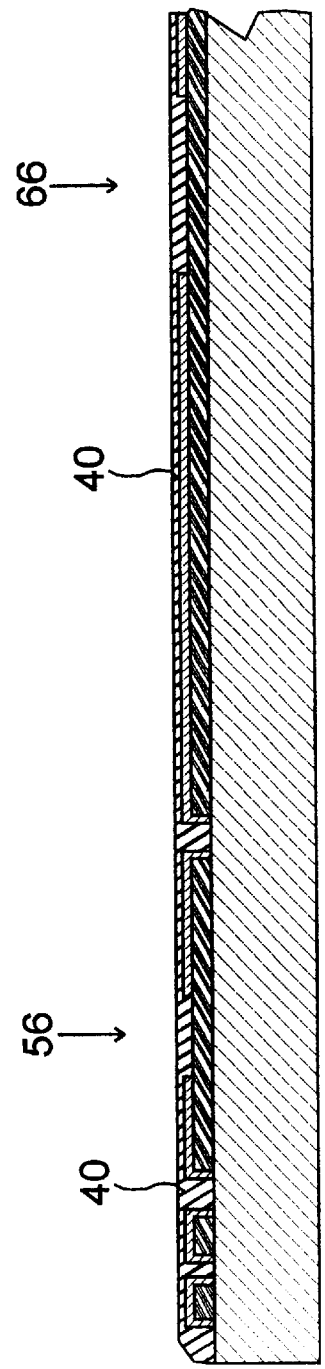

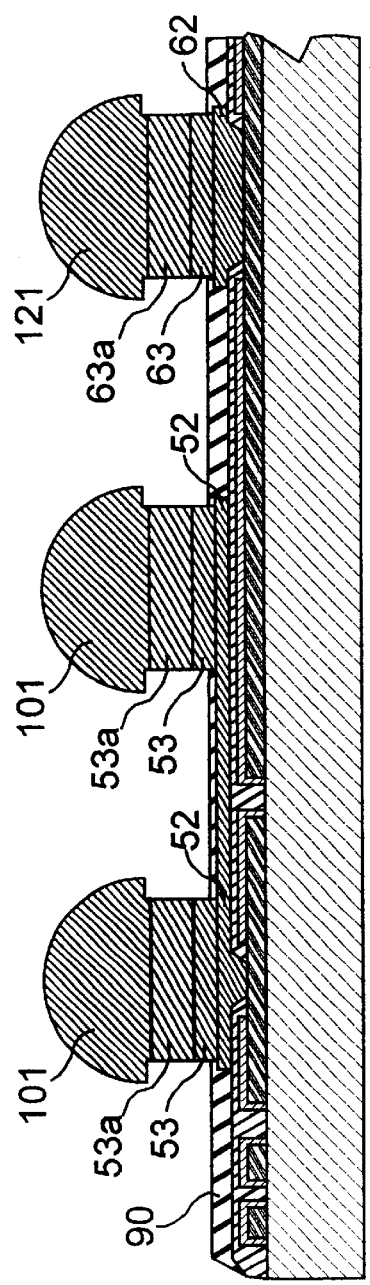
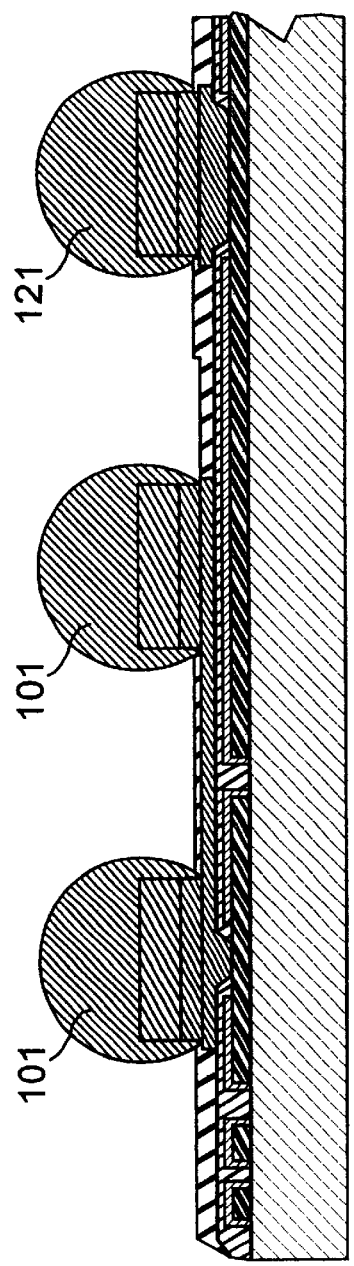

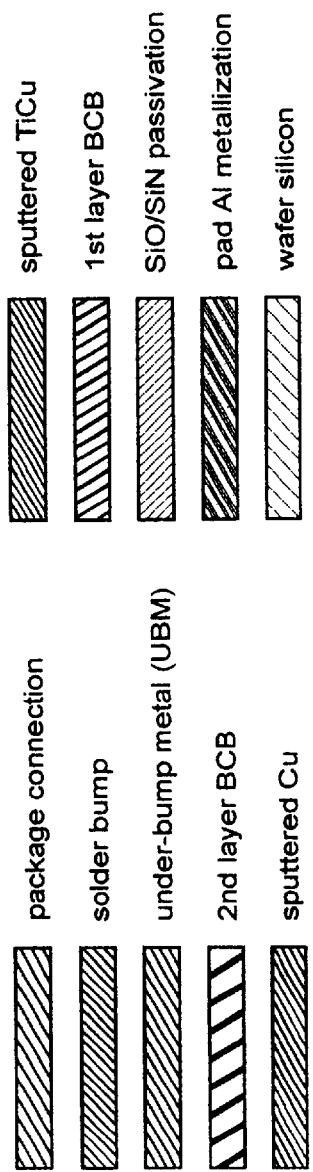
Legend for Figures
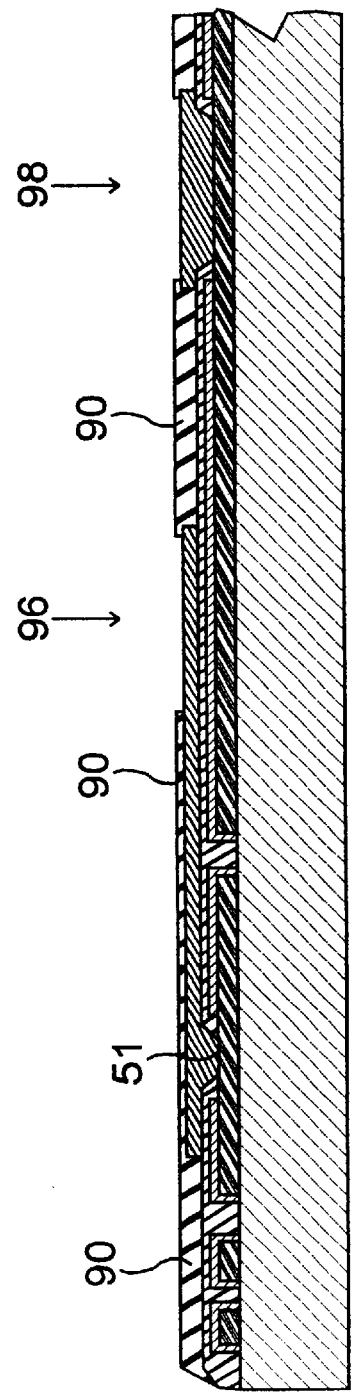
Fig. 26

US 6,649,961 B2

SUPPORTING GATE CONTACTS OVER SOURCE REGION ON MOSFET DEVICES

FIELD OF INVENTION

This invention relates to semiconductor fabrication, and more specifically to power MOSFET contact fabrication.

Definitions

BCB: benzocyclobutene, an insulating polymer widely used as a photosensitive patterning material and insulator.

RDSon: the on-state drain-to-source resistance in a MOSFET.

UBM: under-bump metal, the conductive metal used to connect a source or gate contact to an external circuit via a surface solder bump.

DISCUSSION OF PRIOR ART

MOSFET die layouts are designed to maximize the source contact area for optimum RDSon performance. This approach leaves just enough area for the gate pad to establish one wirebonding connection or bump connection. With the increasing trend toward wireless packaging via wafer bumping and flipchip technologies, a single gate bump contact serves the purpose. A disadvantage of single gate bump contact designs is that mechanical and thermal stress experienced by this single gate bump contact can cause disconnection. Inherent in multilayer metal stack technology, as commonly used in MOSFET contact areas, is the frequent problem of delamination of such metallization from its underlying dielectric layer due to differences between the coefficients of thermal expansion of the metallization and the dielectric when the stack is subjected to thermal stress. Such delamination of the metallization renders the parent device inoperable and unusable. Increasing the gate contact area in an attempt to guarantee robustness does not help, since the resulting contact still constitutes only a single connection.

SUMMARY

By increasing the number of MOSFET gate pads, the invention makes MOSFET gate connections more durable and reliable. The invention extends under-bump metal laterally from the gate contact with the gate pad metallization out to two or more gate pads not overlying the gate pad metallization, thereby minimizing the risk of delamination of the metallization due to thermal and mechanical stresses in assembly and operation. The gate pads use source pad space adjacent to the original gate contact. The invention's use of more than one gate pad further reduces such failure risks. The result is a reliable, durable MOSFET gate contact compatible with current assembly methods.

DESCRIPTION OF DRAWINGS

FIGS. 8–25 show the fabrication steps for the invention.

FIGS. 26–34 show alternate fabrication steps for the second embodiment of the invention.

Figure 1:
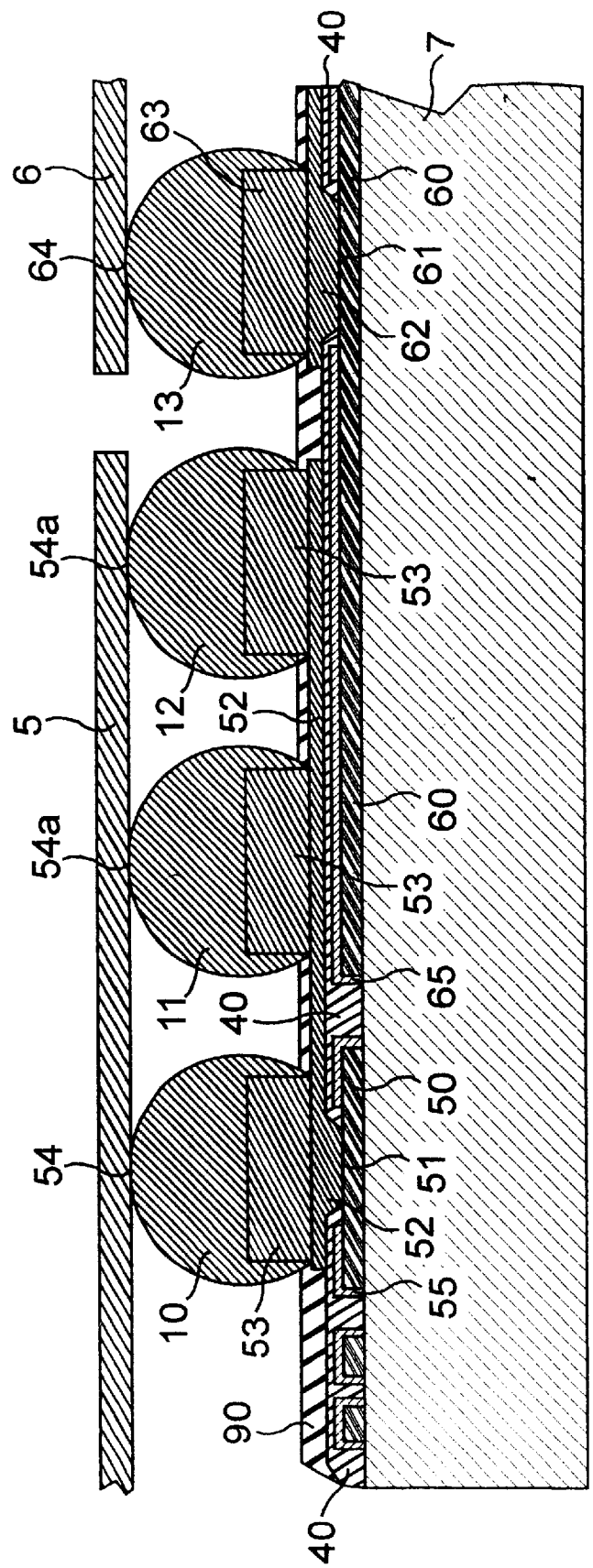
FIG. 1 shows a cross section of the invention's gate bump and source bump structure.

A legend for all figures is shown on the drawing sheet with FIG. 26.

DETAILED DESCRIPTION OF INVENTION

This invention details a practical approach of creating more gate contacts on a MOSFET die. The invention's approach resembles the redistribution or routing techniques used in ball grid array (BGA) chips, in which the contact opening of a pad is relocated to another position in substrate layout design. The present invention creates dual or multiple gate pads for a single gate contact. For bumped gate pads, the stress is therefore distributed among the pads, so that the stress experienced by one connection is equal to the total stress divided by the number of connections (i.e., for a dual connection, stress is divided by 2; for a triple connection, stress is divided by 3). The strength of the entire gate connection is multiplied twice if it uses a dual gate contact, or three times if it uses a triple gate contact. This approach sharply reduces the mechanical stress introduced during assembly processing.

In a first embodiment, the invention adds one or more gate bump contacts by reallocating source bump contact locations to use as gate bump contacts. The added gate bump contacts provide both multiple electrical gate connections and multiple gate lead frame support points, at the cost of the loss of a few source bump contacts.

See FIG. 1, which shows a gate bump 10 and additional gate bumps 11, 12 connecting a gate contact 51 with package control gate connection 5, via gate bump contacts 54, 54a. FIG. 1 also shows one of a number of source bumps 13, connecting a source metallization 60, source contact 61, and source under bump metal 63, 63a with package source connection 6, via source bump contacts 64. The invention fabricates gate bump 10 directly over gate metallization 50, gate contact 51, and gate under bump metal 53, 53a, to make external gate bump contact 54 with package control gate connection 5. The invention also extends under bump metal 52 laterally over source metallization 60, source passivation layer 65, and insulating layer 40 to connect gate contact 51 to additional gate bump contacts 11 and 12, and thus to additional gate bump contacts 54a over source metallization 60. Added gate bumps 11 and 12 furnish added mechanical support for the package control gate connections, thereby reducing the stress per gate contact and the consequent risk of gate contact failure.

Figure 2:
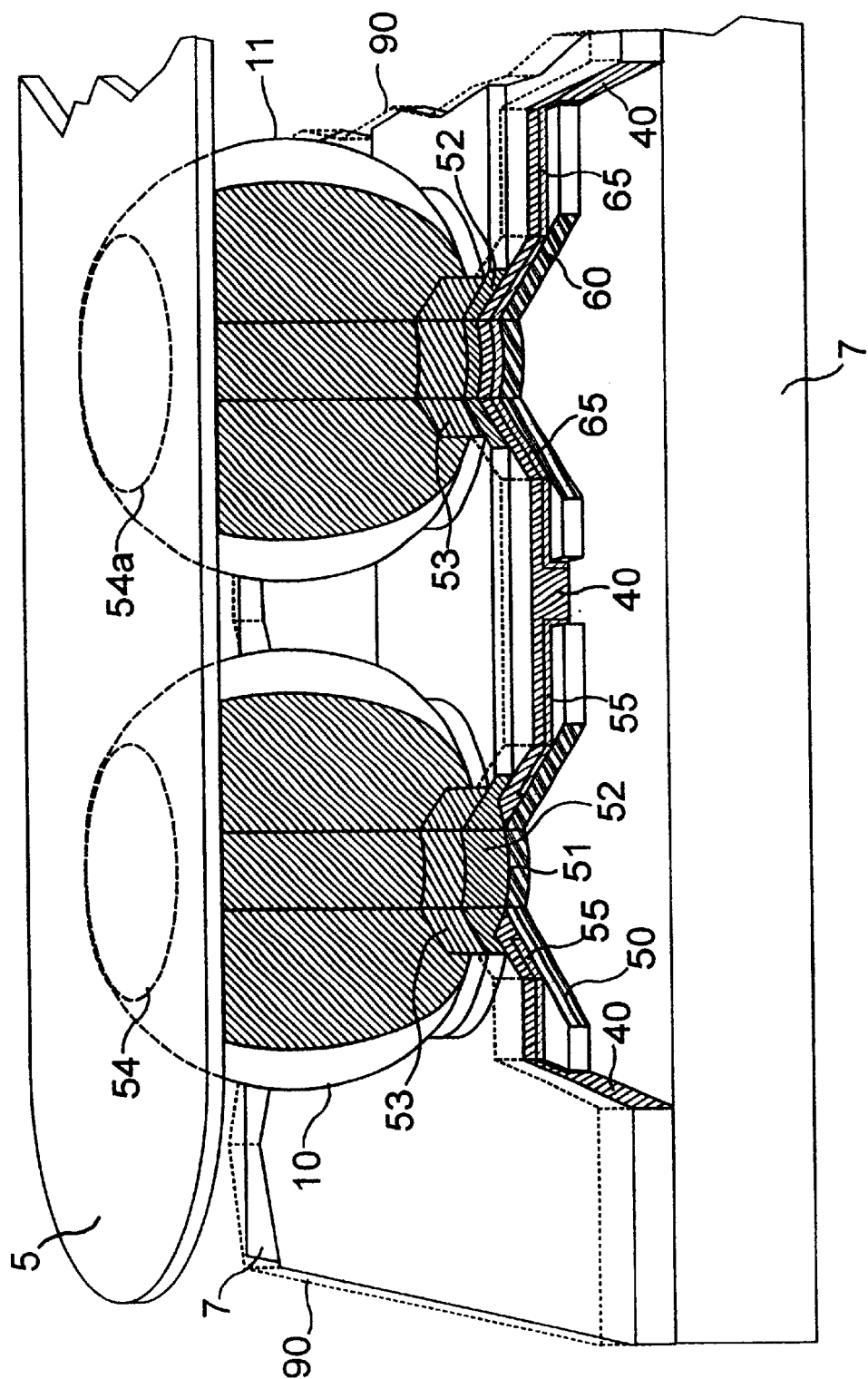
FIG. 2 shows a cutaway view of the invention's gate bump structure.

A cutaway view of the first embodiment of the invention appears in FIG. 2. This figure shows, from the bottom up, wafer 7, gate metallization 50, gate passivation layer 55, gate contact 51, first insulating layer 40, gate under bump metal 52, second insulating layer 90 (in dotted form, to show underlying layers), gate under bump metal 53, gate bumps 10 and 11, gate bump contacts 54 and 54a, and package control gate connection 5. In this figure the extension of first insulating layer 40 over source passivation layer 65 insulates gate bump 11 from source metallization 60.

Figure 3:
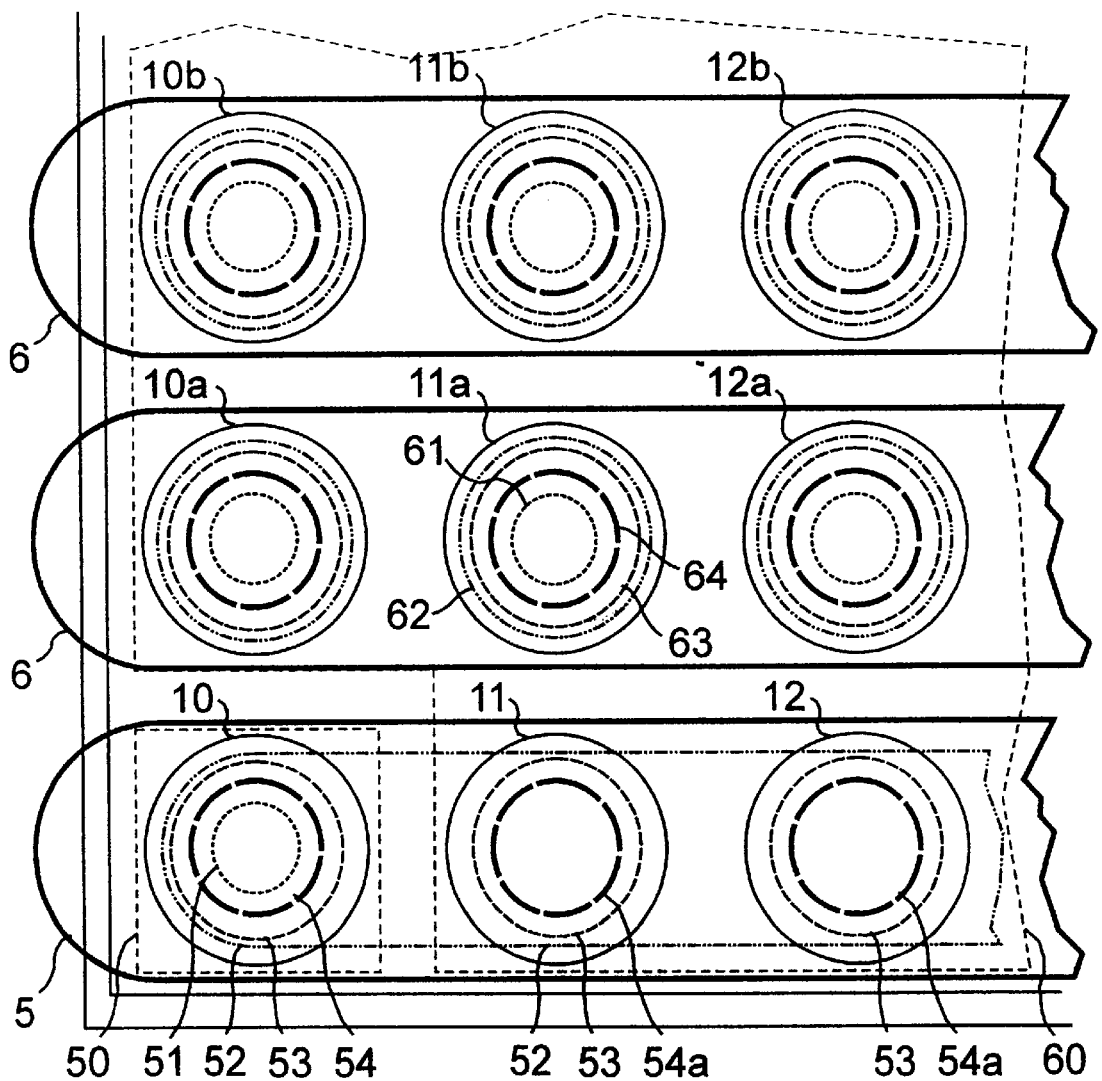
FIG. 3 shows a plan view of the invention's gate and source bump layout.
Figure 4:
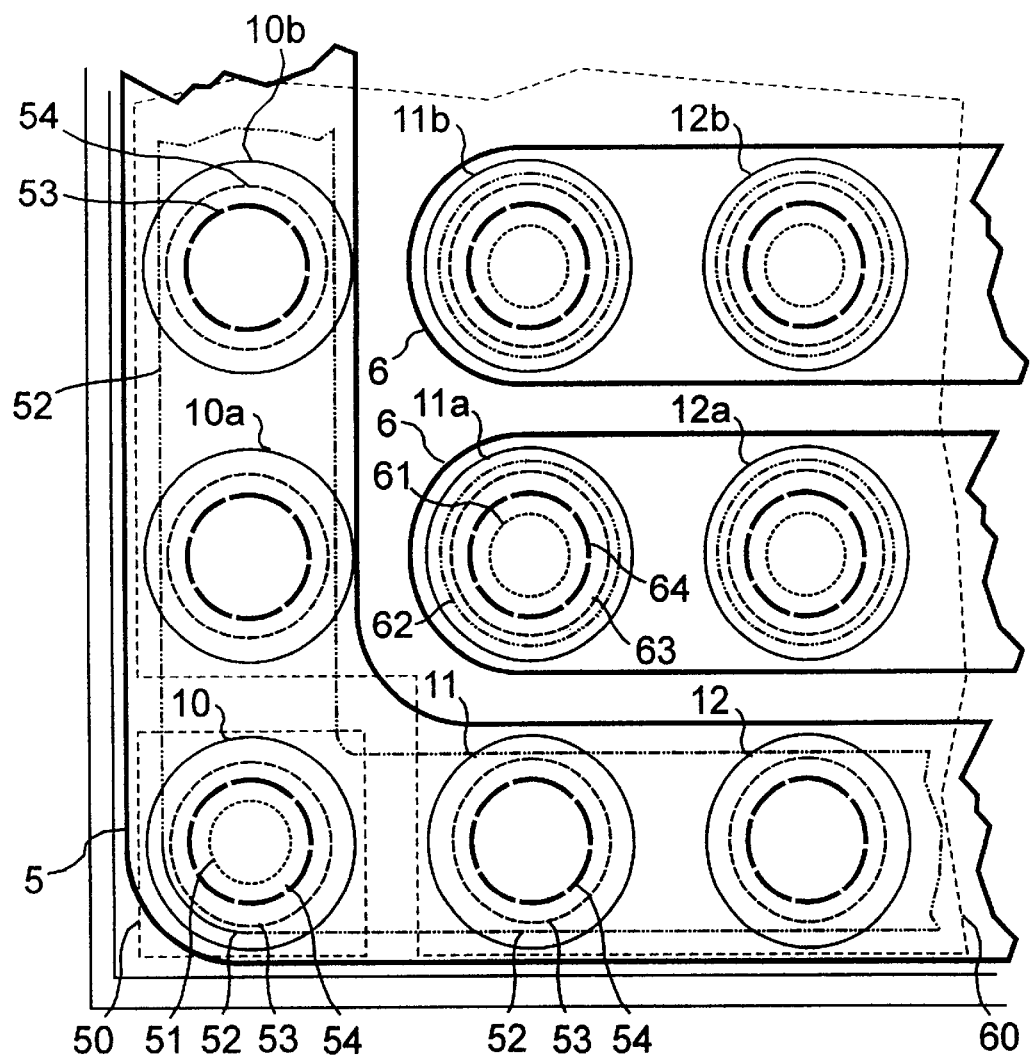
FIG. 4 shows a plan view of an alternate first embodiment of the invention's gate and source bump layout.

FIG. 3 shows a plan view of the invention's gate bump contacts. For clarity of essentials, the insulating layers are not shown in this view. Gate contact 51 connects to gate bump contact 54 for gate bump 10 and gate bump contacts 54a for gate bumps 11, 12 via under bump metal 52, 53, to make contact with package control gate connection 5. FIG. 4 shows a plan view of an alternate first embodiment of the invention using gate bumps 10a and 10b in addition to gate bumps 10, 11 and 12, to provide gate contact support in two dimensions. FIG. Y1d shows a plan view of another alternate first embodiment of the invention using gate bumps 10, 10a, 11, 11a to provide gate contact support in two dimensions.

In a second embodiment, the invention eliminates the multilayer metal from atop the gate contact by laterally offsetting the gate bump contact and multi-metal layers from the gate contact region. This embodiment avoids multi-metal stacking on top of the gate metallization.

Figure 6:
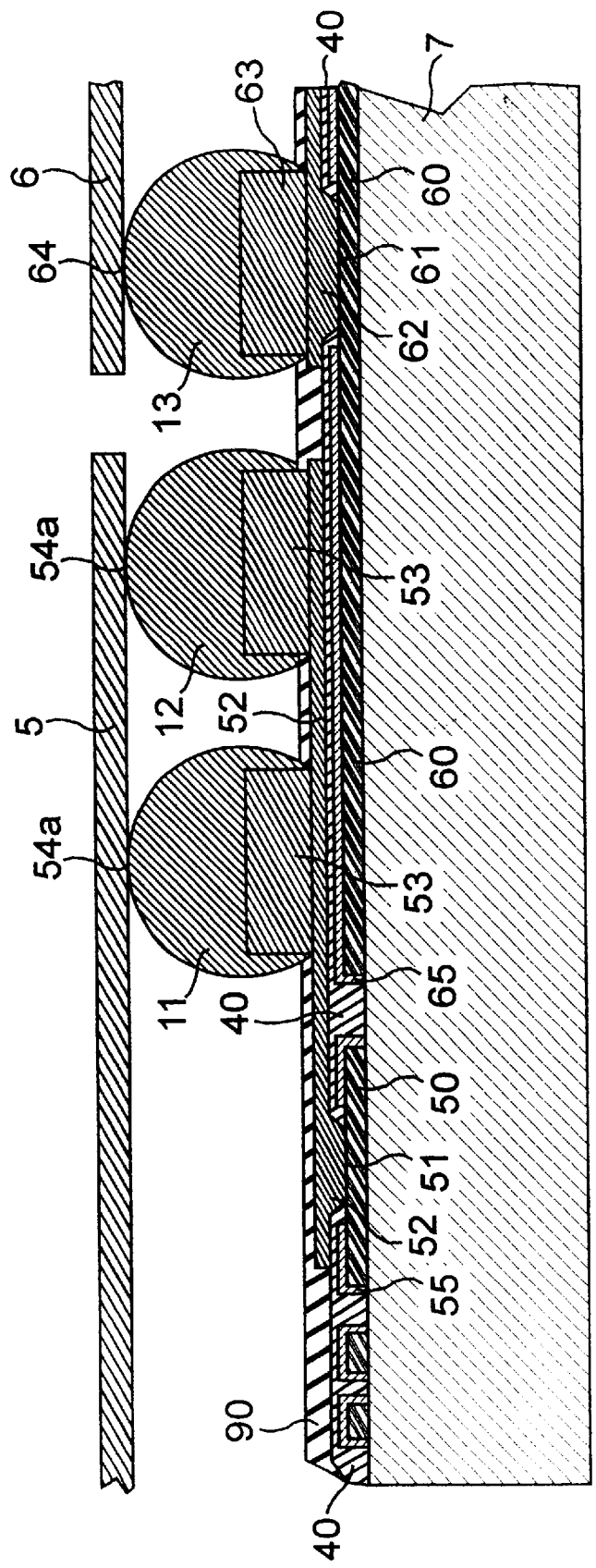
FIG. 6 shows a cross section of a second embodiment of the invention's gate bump and source bump structure.

See FIG. 6, which shows two gate bumps 11, 12 connecting a gate contact 51 with package control gate connection 5, via gate bump contacts 54a. As in FIG. 1, FIG. 6 also shows one of a number of source bumps 13, connecting a source metallization 60, source contact 61, and source under bump metal 63 with package source connection 6, via source bump contacts 64. The invention fabricates gate under bump metal 52 directly over gate metallization 50 and gate contact 51, and extends under bump metal 52 laterally over source metallization 60, source passivation layer 65, and insulating layer 40 to connect gate contact 51 to gate bump contacts 11 and 12, and thus to gate bump contacts 54a over source metallization 60. Gate bumps 11 and 12 furnish added mechanical support for the package control gate connections, thereby reducing the stress per gate contact and the consequent risk of gate contact failure. Since no gate bump is fabricated directly over multiple metal layers 50, 51, 52, and 53 in this embodiment, the risk of delamination of the metallization due to thermal and mechanical stresses in package assembly and operation is minimized.

Figure 5:
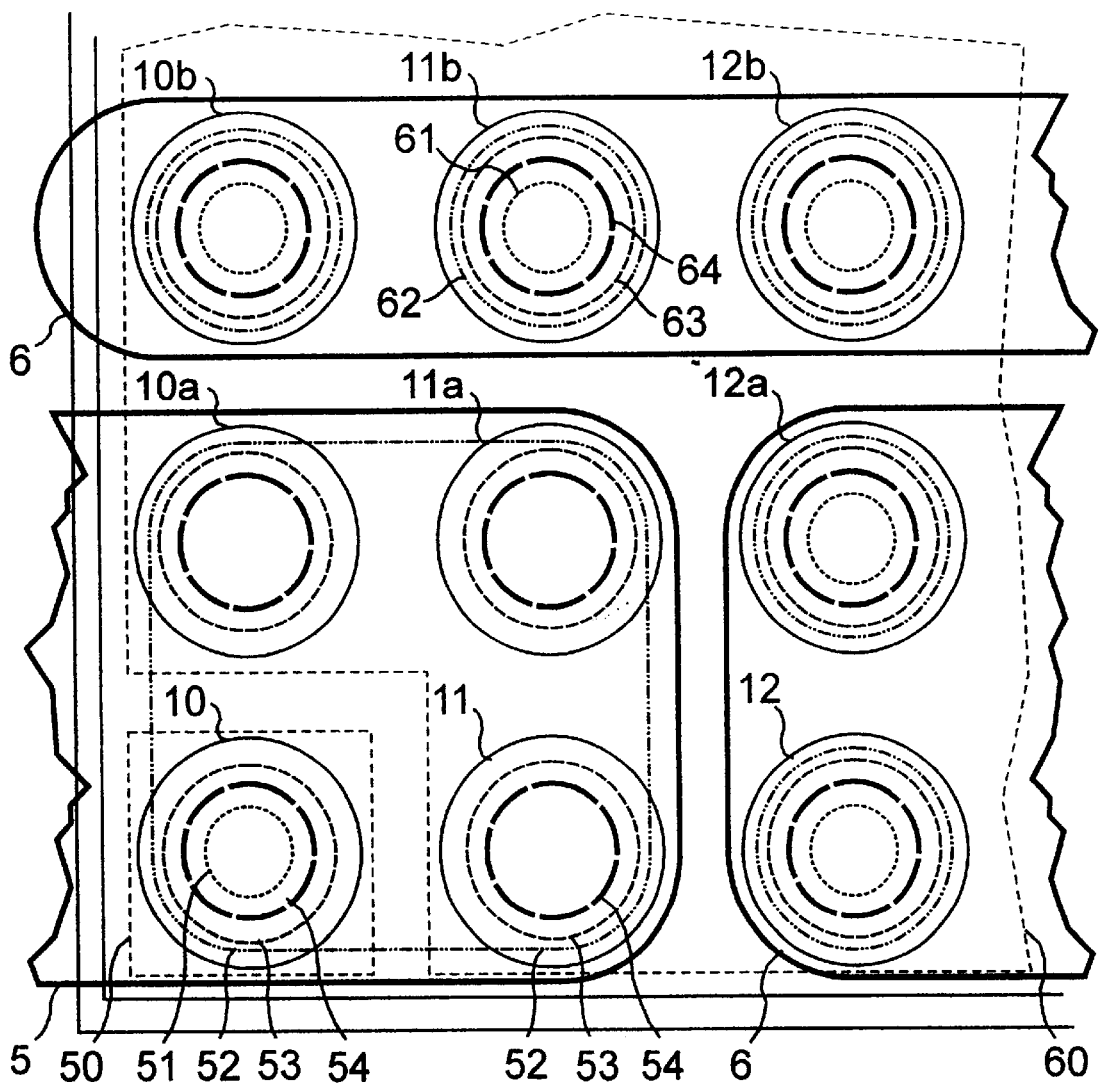
FIG. 5 shows a plan view of another alternate first embodiment of the invention's gate and source bump layout.
Figure 7:
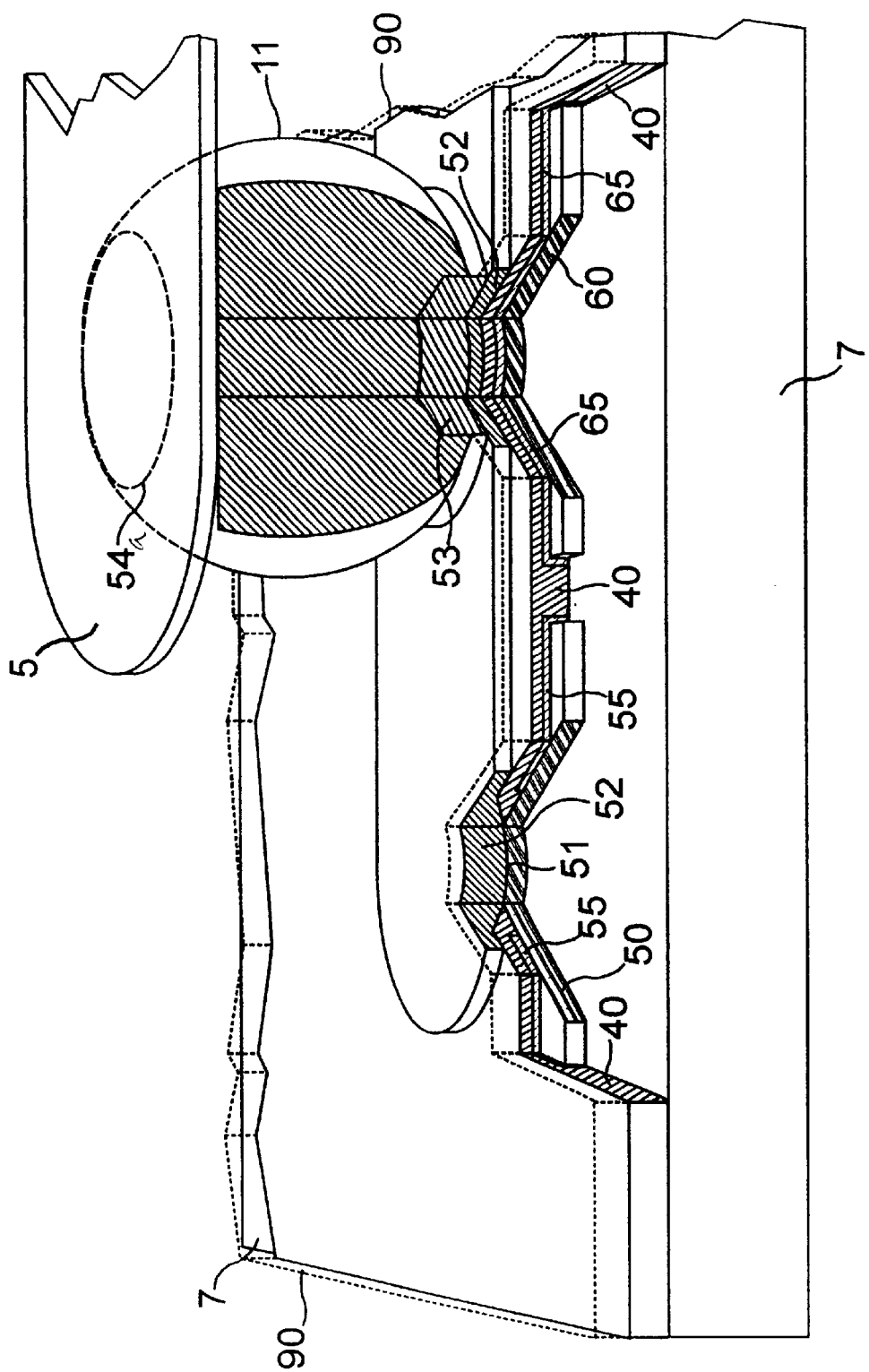
FIG. 7 shows a cutaway view of the second embodiment of the invention's gate bump structure.

A cutaway view of the second embodiment of the invention appears in FIG. 7. This figure shows, from the bottom up, wafer 7, gate metallization 50, gate passivation layer 55, gate contact 51, first insulating layer 40, gate under bump metal 52, second insulating layer 90 (in dotted form, to show underlying layers), gate under bump metal 53, gate bump 11, gate bump contact 54a, and package control gate connection 5. In this figure the extension of first insulating layer 40 over source passivation layer 65 insulates gate bump 11 from source metallization 60, and there is no gate bump directly over gate contact 51. Additional gate bumps 54a are not shown in this figure, but are present in the invention in alternate embodiments as indicated in FIGS. 3, 4, and 5.

Figure 10:
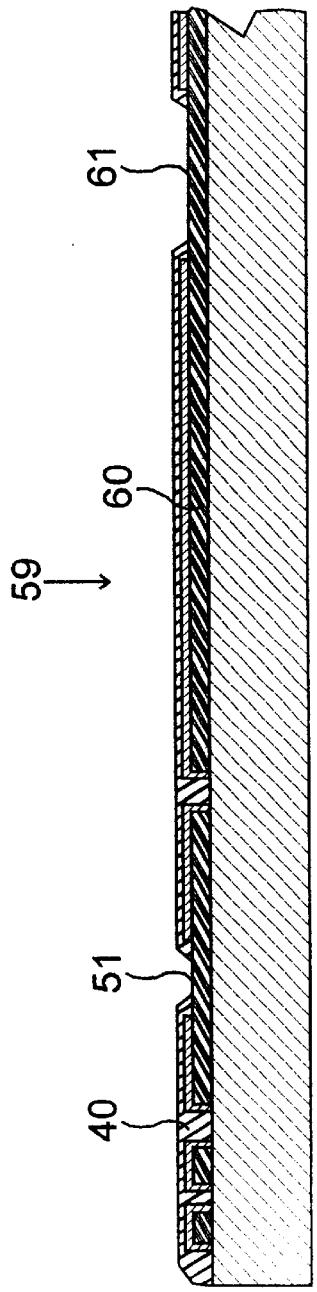
Figure 11:
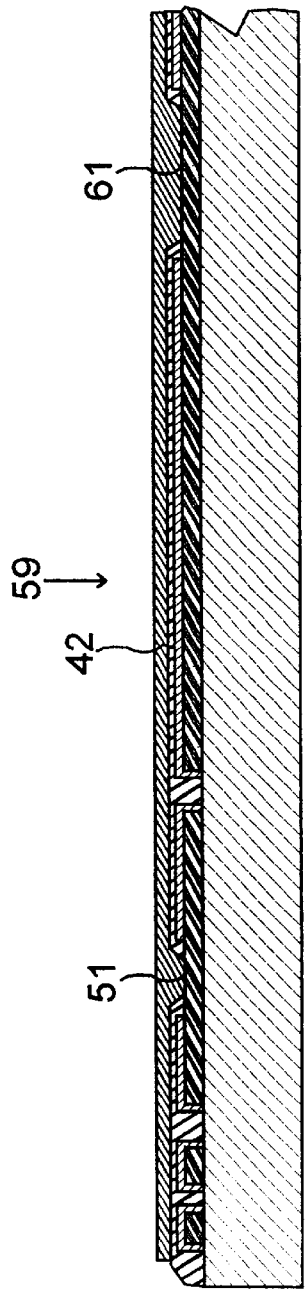
Figure 12:
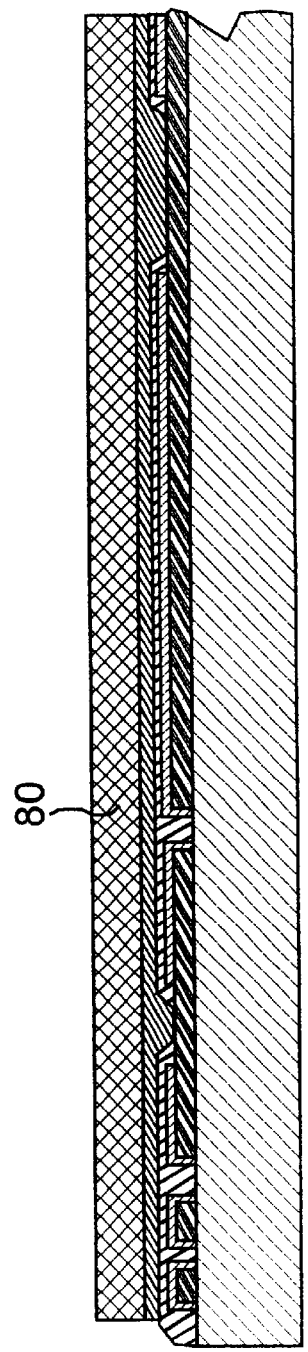
Figure 13:
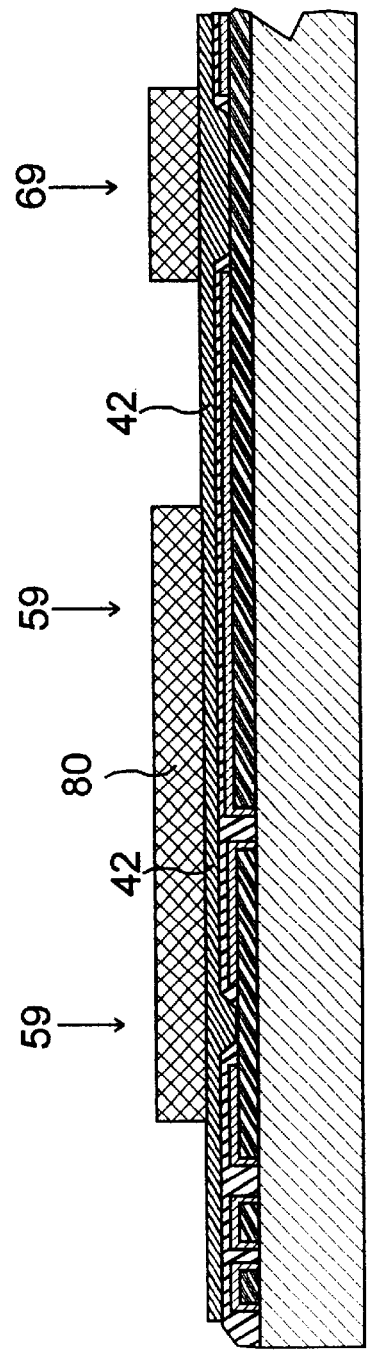
Figure 14:
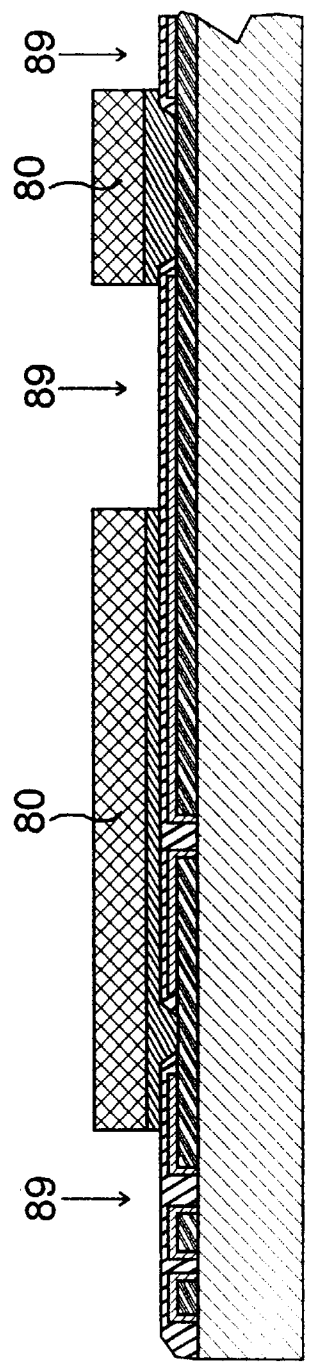
Figure 15:
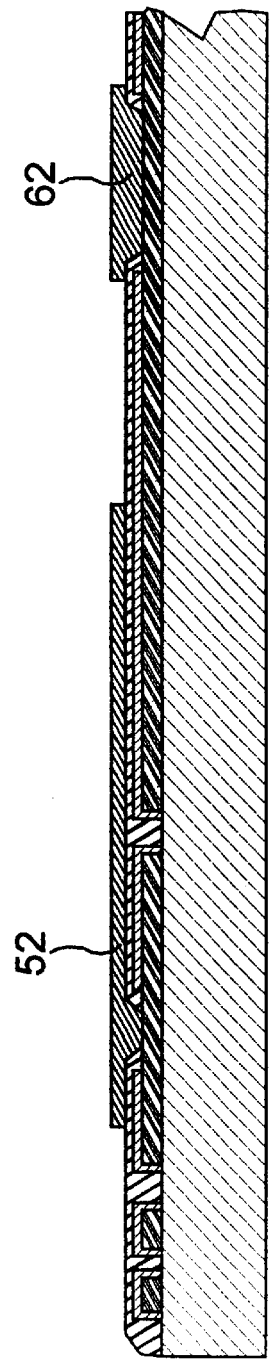
Figure 16:
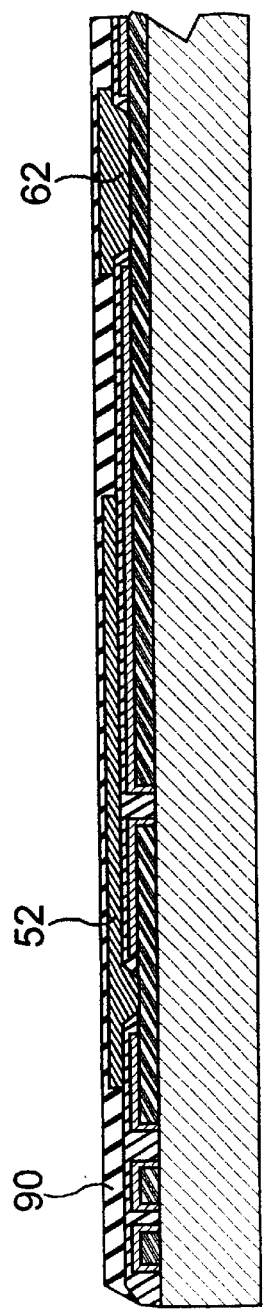

The invention's fabrication process is as follows. See FIG. 8. A semiconductor wafer 7 has gate metallization 50 and source metallization 60, silicon oxide or silicon nitride gate passivation layer 55 and source passivation layer 65, and gate and source contact passivation openings 56 and 66 respectively already in place. The wafer is cleaned. A first BCB layer 40 is coated and baked on the wafer as shown in FIG. 9. The BCB is exposed to define the exposed gate contact 51 and source contacts 61, and then developed (FIG. 10) to expose contacts 51 and 61. BCB is left in place over additional gate bump areas 59 above source Al metallization 60, to insulate the eventual gate bumps from the source metallization. TiCu 42, serving as a layer of under bump metal, is then sputtered onto gate contact 51 and source contacts 61 for metallization (FIG. 11). TiCu 42 deposited over additional gate bump areas 59 does not contact source Al metallization 60 in areas 59, and will serve as a gate contact lead for the gate support bumps used to support the gate lead frame contacts physically. A first photoresist coating 80 is added (FIG. 12), UV-exposed and developed to protect bump and lead areas 59, 69 where TiCu is to be retained (FIG. 13). The unprotected Cu and TiCu are etched in areas 89 (FIG. 14), and photoresist 80 is stripped off (FIG. 15), exposing gate under bump metal 52 and source under bump metal 62. A second BCB layer 90 is coated and baked on the wafer (FIG. 16). This concludes the stages of fabrication common to both the first and second embodiments.

Figure 17:
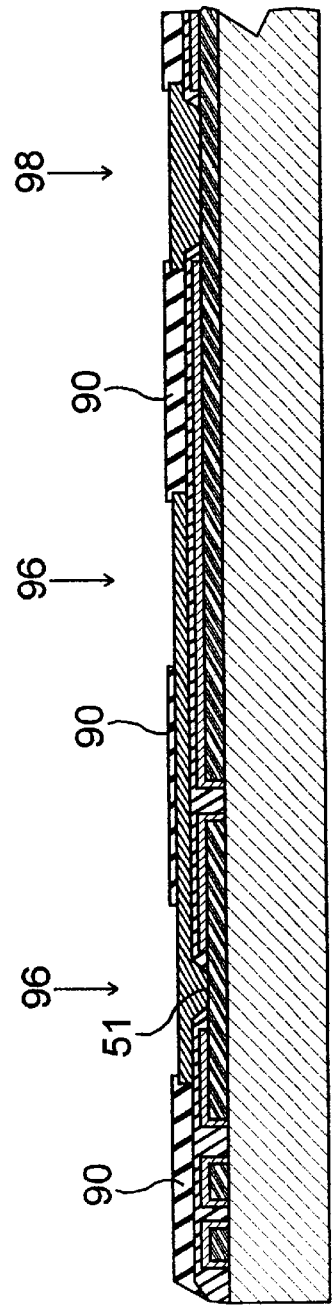
Figure 18:
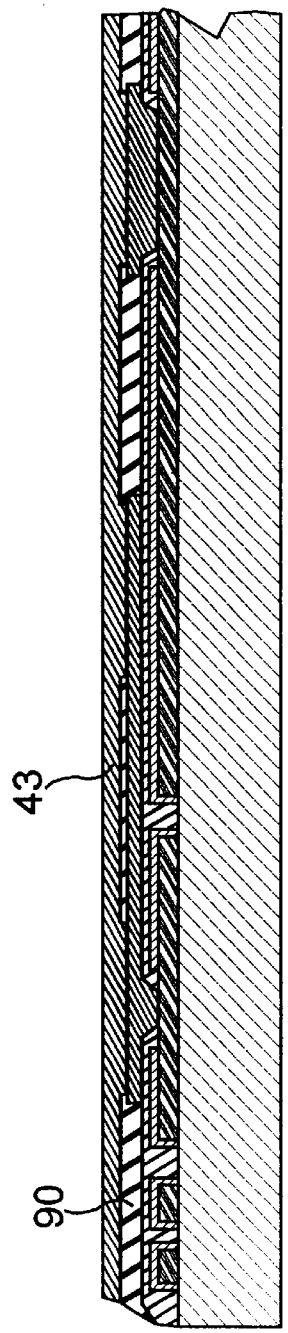
Figure 19:
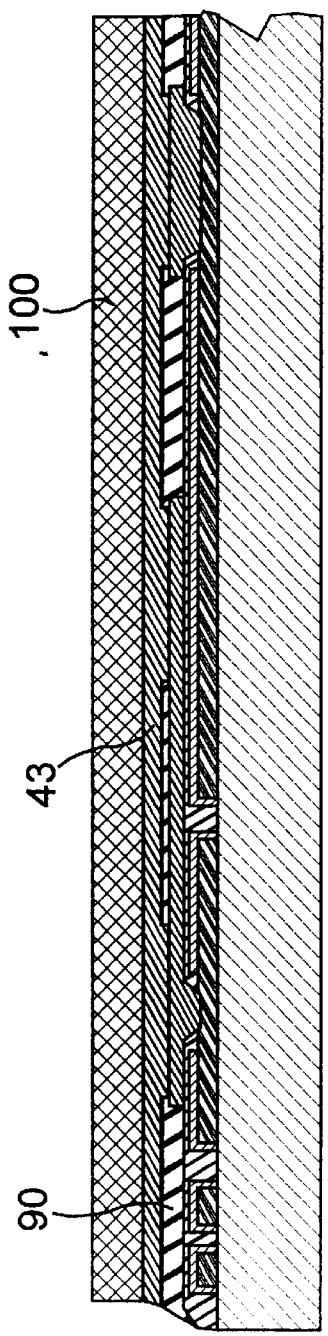
Figure 20:
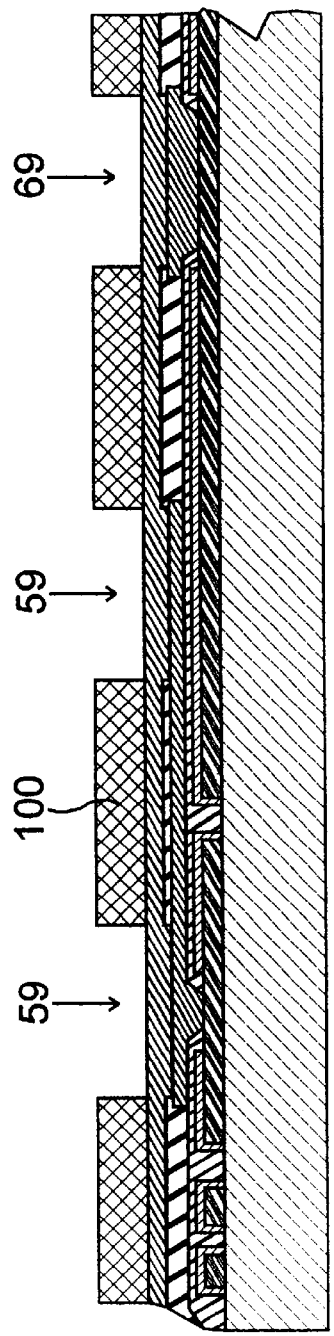
Figure 21:
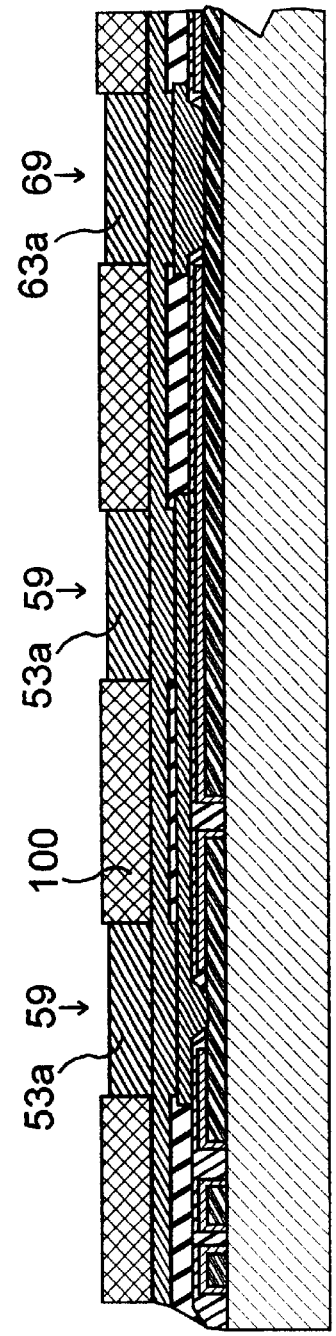
Figure 22:
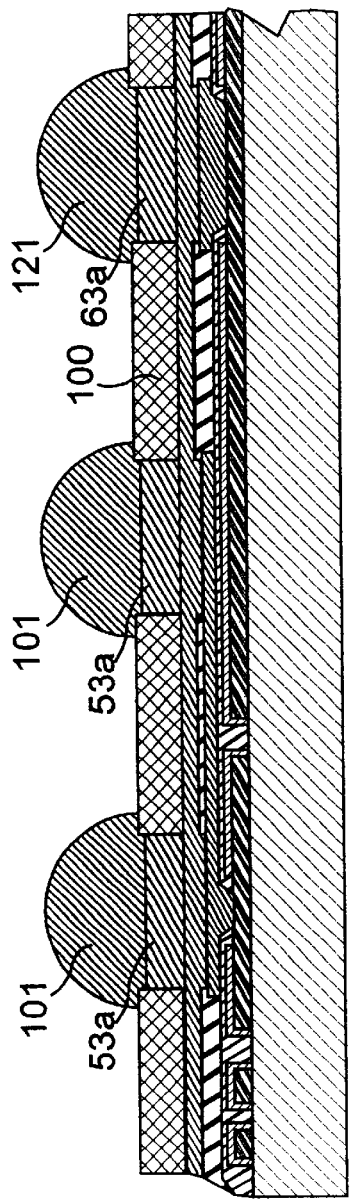
Figure 23:
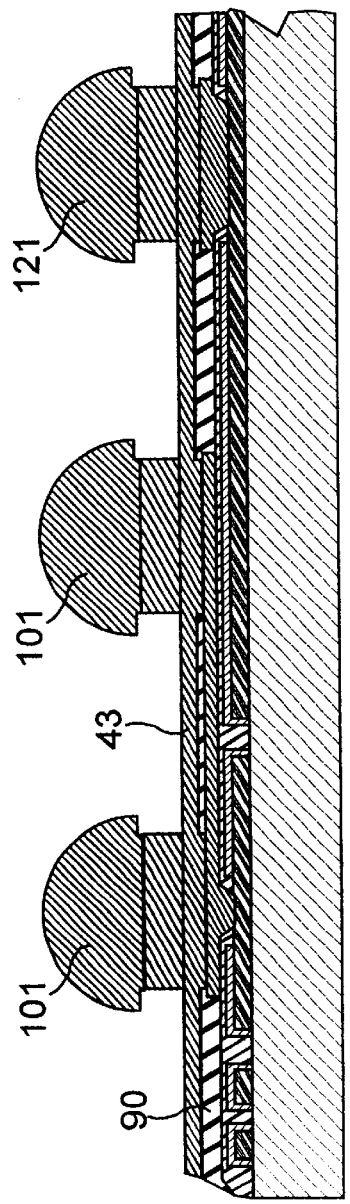

For the invention's first embodiment, second BCB layer 90 is exposed and developed (FIG. 17) to define each gate bump termination, or pad opening, 96 and each source bump termination, or pad opening, 98. In the first embodiment, a pad opening 96 is fabricated directly over gate contact 51. Cu is sputtered onto the wafer surface to provide a conductive layer 43 (FIG. 18). A second photoresist coating 100 is added onto the sputtered Cu 43 (FIG. 19), and is UV-exposed and developed (FIG. 20) to expose gate bump areas 59 and source bump areas 69 of Cu where gate solder bumps and source solder bumps respectively will eventually be placed. Cu 53a, 63a is plated onto exposed Cu areas 59, 69 respectively (FIG. 21) to raise the level of Cu to ensure that enough bulk copper interconnect is retained during subsequent processing and soldering where part of the copper is consumed in the formation of Cu—Sn intermetallics. Gate solder bumps 101 and source solder bumps 121 are plated onto Cu 53a and 63a respectively (FIG. 22), with photoresist 100 supporting the edges of the bumps around each Cu area. Photoresist 100 is stripped (FIG. 23), exposing sputtered Cu layer 43, and sputtered Cu layer 43 is etched (FIG. 24) to define the conductive gate metal 53 and conductive source metal 63 and expose the second BCB layer 90. The plated solder is reflowed (FIG. 25) to form the final gate solder bumps 101 and source solder bumps 121.

Figure 27:
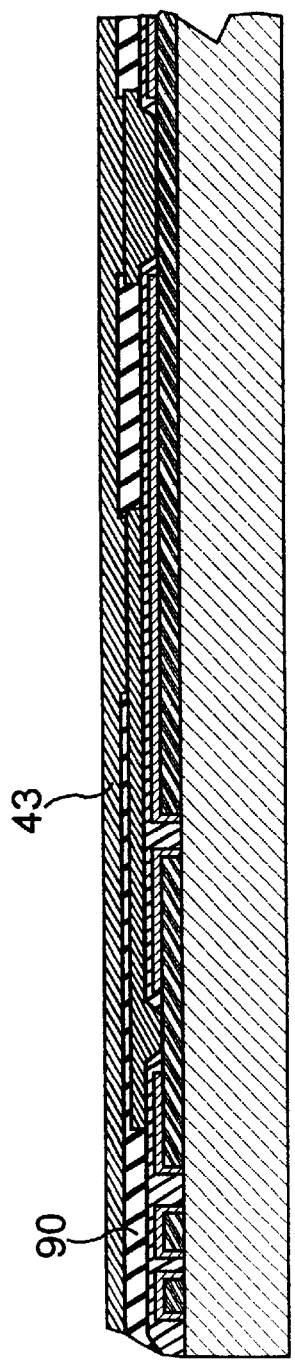
Figure 28:
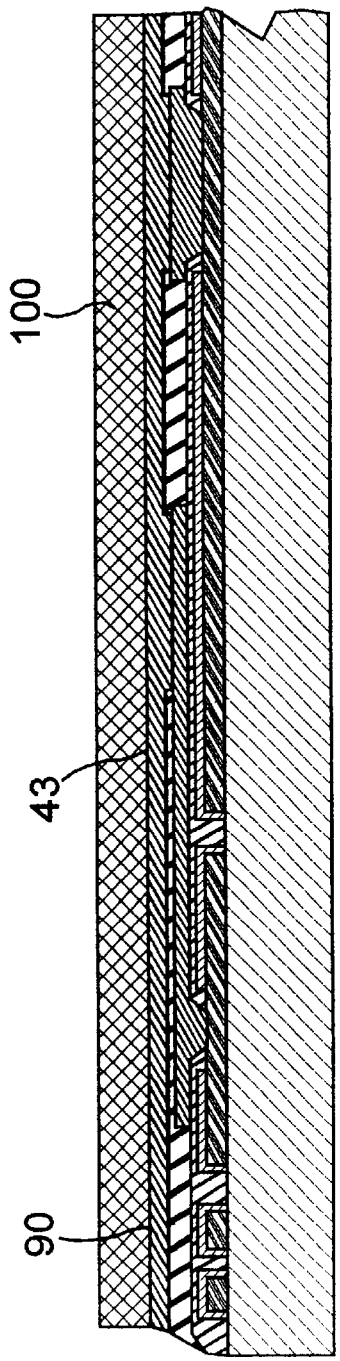
Figure 29:
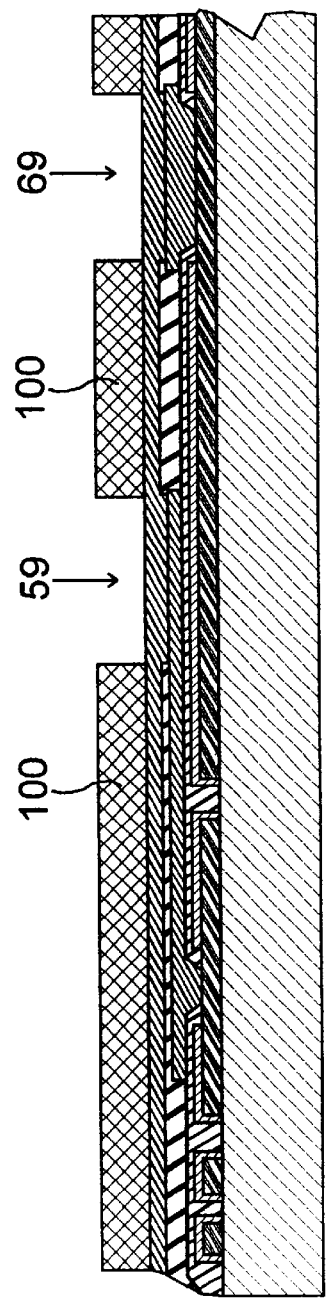
Figure 30:
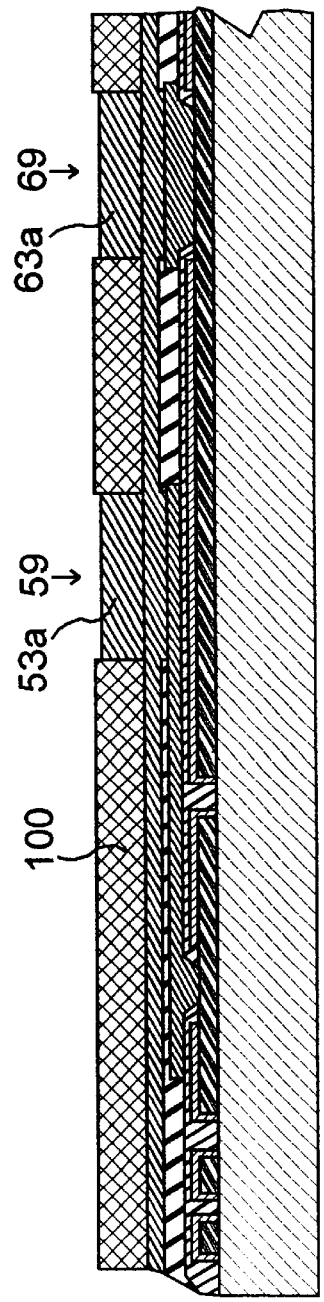
Figure 31:
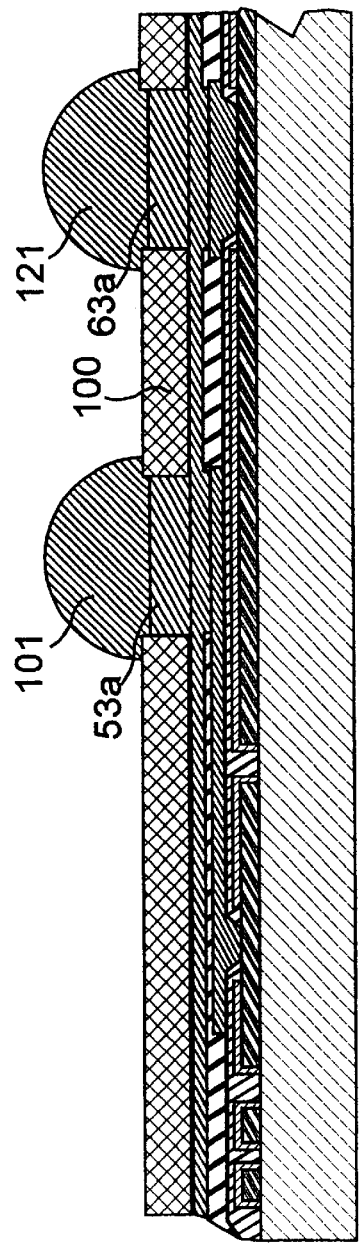
Figure 32:
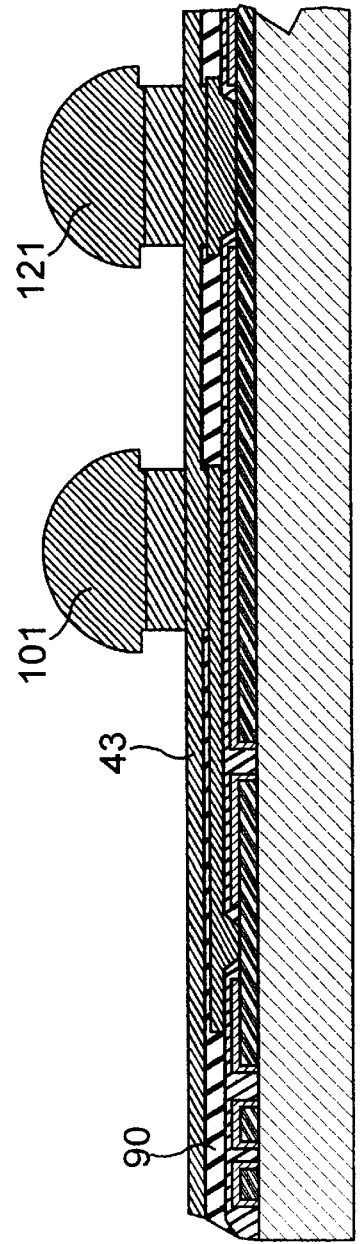
Figure 33:
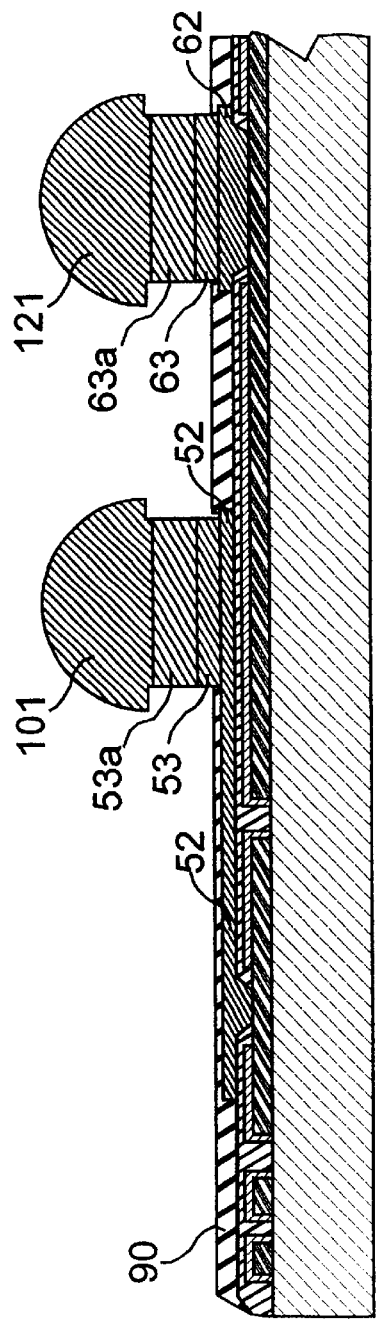
Figure 34:
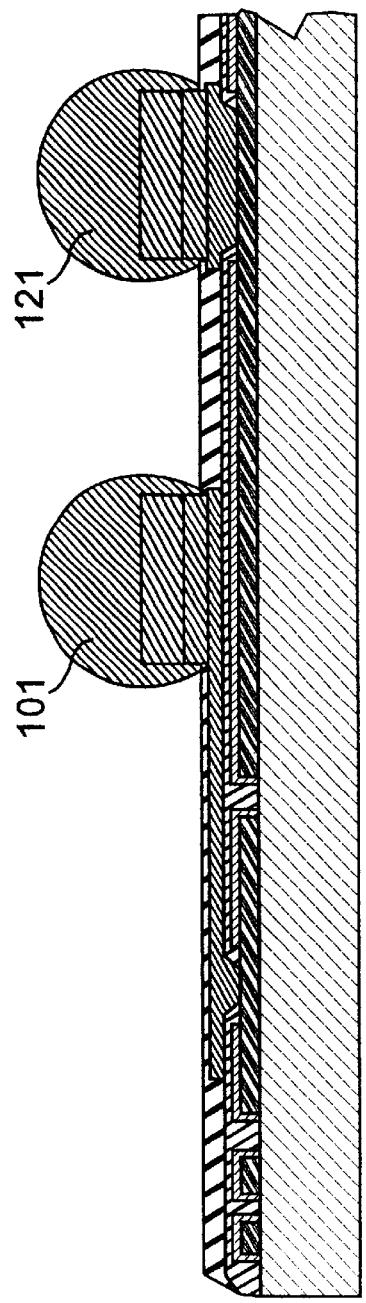

For the invention's second embodiment, second BCB layer 90 is exposed and developed (FIG. 26) to define each gate bump termnination, or pad opening, 96 and each source bump termination, or pad opening, 98. In the second embodiment, no gate bump termination is fabricated over gate contact 51. More than one gate bump termination may be fabricated over the source metallization area as desired. Cu is sputtered onto the wafer surface to provide a conductive layer 43 (FIG. 27). A second photoresist coating 100 is added onto the sputtered Cu 43 (FIG. 28), and is UV-exposed and developed (FIG. 29) to expose gate bump areas 59 and source bump areas 69 of Cu where gate solder bumps and source solder bumps respectively will eventually be placed. Cu 53a, 63a is plated onto exposed Cu areas 59, 69 respectively (FIG. 30) ensure that there is enough bulk copper interconnect material to survive subsequent processing and soldering that consumes copper to form Cu—Sn intermetallics. Gate solder bumps 101 and source solder bumps 121 are plated onto Cu 53a and 63a respectively (FIG. 31), with photoresist 100 supporting the edges of the bumps around each Cu area. Photoresist 100 is stripped (FIG. 32), exposing sputtered Cu layer 43, and sputtered Cu layer 43 is etched (FIG. 33) to define the conductive gate metal 53 and conductive source metal 63 and expose the second BCB layer 90. The plated solder is reflowed (FIG. 34) to form the final gate solder bumps 101 and source solder bumps 121.

Conclusion, Ramifications, and Scope of Invention

From the above descriptions, figures and narratives, the invention=s advantages in providing reliable, durable, and economical MOSFET gate contacts should be clear.

Although the description, operation and illustrative material above contain many specificities, these specificities should not be construed as limiting the scope of the invention but as merely providing illustrations and examples of some of the preferred embodiments of this invention.

Thus the scope of the invention should be determined by the appended claims and their legal equivalents, rather than by the examples given above.

What is claimed:

1. A semiconductor apparatus having a robust and reliable MOSFET gate external connection, comprising:

a semiconductor body having a first surface and a second surface;

a source contact area on the first surface of the semiconductor body;

a drain contact area on the second surface of the semiconductor body;

a gate contact area on the first surface of the semiconductor body and separate from the source contact area;

a source contact metallization layer overlying the source contact area;

a gate contact metallization layer overlying the gate contact area;

a source contact passivation layer overlying the source contact metallization layer and having one or more openings exposing a portion of the surface of the source contact metallization layer;

a gate contact passivation layer overlying the gate contact metallization layer and having one or more openings exposing a portion of the surface of the gate contact metallization layer;

a first insulating layer overlying the gate contact passivation layer, overlying one or more exposed areas of the source metallization layer, and having one or more openings exposing a portion of the surface of the gate contact metallization layer;

a first conducting metal layer overlying portions of the first insulating layer overlying the one or more exposed areas of the source metallization layer, and connected to the gate contact metallization layer via the openings in the first insulating layer;

a second insulating layer overlying the first conducting metal layer and the first insulating layer and having two or more openings each overlying the source contact metallization layer wherein each such opening exposes a portion of the surface of the first conducting metal layer;

a second conducting metal layer having two or more zones each overlying and in contact with one exposed portion of the first conducting metal layer, and each having an outline of size and shape substantially the same as the exposed portion of the outline of the first conducting metal layer.

a metal plating layer having two or more zones each overlying and in contact with one exposed portion of the second conducting metal layer overlying an exposed portion of the first conducting metal layer, and each having an outline of size and shape substantially the same as the exposed portion of the outline of the first conducting metal layer; and two or more solder bumps each overlying one metal plating layer zone, and each having an outline of size and shape substantially the same as the exposed portion of the outline of the metal plating layer.

2. The apparatus of claim 1 wherein the semiconductor body comprises wafer silicon.

3. The apparatus of claim 1 wherein the source contact metallization layer comprises aluminum.

4. The apparatus of claim 1 wherein the gate contact metallization layer comprises aluminum.

5. The apparatus of claim 1 wherein the source contact passivation layer comprises silicon dioxide.

6. The apparatus of claim 1 wherein the source contact passivation layer comprises silicon nitride.

7. The apparatus of claim 1 wherein the gate contact passivation layer comprises silicon dioxide.

8. The apparatus of claim 1 wherein the gate contact passivation layer comprises silicon nitride.

9. The apparatus of claim 1 wherein the first insulating layer comprises benzocyclobutene.

10. The apparatus of claim 1 wherein the first conducting metal layer comprises titanium.

11. The apparatus of claim 1 wherein the first conducting metal layer comprises copper.

12. The apparatus of claim 1 wherein the second insulating layer comprises benzocyclobutene.

13. The apparatus of claim 1 wherein the second conducting metal layer comprises copper.

14. The apparatus of claim 1 wherein the metal plating layer comprises copper.

15. The apparatus of claim 1 wherein the metal plating layer comprises nickel.

16. The apparatus of claim 1 further comprising two or more solder bumps each overlying one metal plating layer zone, and each having an outline of size and shape substantially the same as the exposed portion of the outline of the metal plating layer.

17. A method for fabricating a robust and reliable MOSFET gate external connection on a semiconductor apparatus, comprising the steps of:

with a semiconductor wafer having gate and source metallizations and silicon oxide or silicon nitride passivations with contact passivation openings already in place on a first surface of the wafer, cleaning the wafer;

coating the first surface of the wafer with a first photosensitive insulating layer;

baking the first photosensitive insulating layer on the wafer;

exposing and developing the first photosensitive insulating layer to define exposed gate and source contact areas;

sputtering a first conducting metal onto the first insulating layer and the exposed gate and source contact areas;

coating the first conducting metal with a first photoresist coating;

exposing and developing the first photoresist coating to define protected areas for the first conducting metal;

etching the first conducting metal to leave two or more conducting surface pathways of the first conducting metal leading from the gate contact area to surface areas above the source contact area;

stripping the first photoresist coating;

coating the exposed first photosensitive insulating layer and the exposed first conducting metal with a second photosensitive insulating layer;

baking the second photosensitive insulating layer on the wafer;

exposing and developing the second photosensitive insulating layer to expose the first conducting metal in the surface areas above the source contact area to create two or more exposed gate pad contacts;

sputtering a second conducting metal onto the second photosensitive insulating layer and the exposed gate pad contacts;

coating the second conducting metal with a second photoresist coating;

exposing and developing the second photoresist coating to define protected areas for the second conducting metal;

etching the second conducting metal to leave two or more conducting metal areas over the exposed gate pad contacts; and plating a third conducting metal onto the second conducting metal over the exposed gate pad contacts.

18. The method of claim 17 further comprising the steps of:

plating solder bumps onto the third conducting metal;

stripping the second layer of photoresist to expose the second conducting metal layer;

etching the sputtered second conducting metal layer to define gate and source contact conducting areas and expose the second photosensitive insulating layer; and reflowing the plated solder to form final solder bumps.

19. The method of claim 17 further comprising the steps of:

stripping the second layer of photoresist to expose the second conducting metal layer; and etching the sputtered second conducting metal layer to define gate and source contact conducting areas and expose the second photosensitive insulating layer.

20. The method of claim 17 wherein the step of coating the first surface of the wafer with a first photosensitive insulating layer further comprises the step of coating the first surface of the wafer with benzocyclobutene.

21. The method of claim 17 wherein the step of sputtering a first conducting metal onto the first insulating layer and the exposed gate and source contact areas further comprises the step of sputtering titanium onto the first insulating layer and the exposed gate and source contact areas.

22. The method of claim 17 wherein the step of sputtering a first conducting metal onto the first insulating layer and the exposed gate and source contact areas further comprises the step of sputtering copper onto the first insulating layer and the exposed gate and source contact areas.

23. The method of claim 17 wherein the step of coating the exposed first photosensitive insulating layer and the exposed first conducting metal with a second photosensitive insulating layer further comprises the step of coating the exposed first photosensitive insulating layer and the exposed first conducting metal with benzocyclobutene.

24. The method of claim 17 wherein the step of sputtering a second conducting metal onto the second photosensitive insulating layer and the exposed gate pad contacts further comprises the step of sputtering copper onto the second photosensitive insulating layer and the exposed gate pad contacts.

25. The method of claim 17 wherein the step of plating a third conducting metal onto the second conducting metal over the exposed gate pad contacts further comprises the step of plating copper onto the second conducting metal over the exposed gate pad contacts.

26. A semiconductor apparatus having a robust and reliable MOSFET gate external connection, comprising:

a semiconductor body having a first surface and a second surface;

a source contact area on the first surface of the semiconductor body;

a drain contact area on the second surface of the semiconductor body;

a gate contact area on the first surface of the semiconductor body and separate from the source contact area;

a source contact conducting extension means overlying the source contact area;

a gate contact conducting extension means overlying the gate contact area;

a source contact protection means overlying the source contact conducting extension means and having one or more openings exposing a portion of the surface of the source contact conducting extension means;

a gate contact protection means overlying the gate contact conducting extension means and having one or more openings exposing a portion of the surface of the gate contact conducting extension means;

a first insulating layer overlying the gate contact protection means, overlying one or more exposed areas of the source contact conducting extension means, and having one or more openings exposing a portion of the surface of the gate contact conducting extension means;

a first conducting means overlying portions of the first insulating layer overlying the one or more exposed areas of the source contact conducting extension means, and connected to the gate contact conducting extension means via the openings in the first insulating layer;

a second insulating layer overlying the first conducting means and the first insulating layer and having two or more openings each overlying the source contact conducting extension means wherein each such opening exposes a portion of the surface of the first conducting means;

a second conducting means having two or more zones each overlying and in contact with one exposed portion of the first conducting means, and each having an outline of size and shape substantially the same as the exposed portion of the outline of the first conducting means; and a conducting external connection means having two or more zones each overlying and in contact with one exposed portion of the second conducting means overlying an exposed portion of the first conducting means, and each having an outline of size and shape substantially the same as the exposed portion of the outline of the first conducting means.

27. The apparatus of claim 26 wherein the semiconductor body comprises wafer silicon.

28. The apparatus of claim 26 wherein the source contact conducting extension means comprises a metallization layer.

29. The apparatus of claim 28 wherein the metallization layer comprises aluminum.

30. The apparatus of claim 26 wherein the gate contact conducting extension means comprises a metallization layer.

31. The apparatus of claim 30 wherein the metallization layer comprises aluminum.

32. The apparatus of claim 26 wherein the source contact protection means comprises a passivation layer.

33. The apparatus of claim 32 wherein the passivation layer comprises silicon dioxide.

34. The apparatus of claim 32 wherein the passivation layer comprises silicon nitride.

35. The apparatus of claim 26 wherein the gate contact protection means comprises a passivation layer.

36. The apparatus of claim 35 wherein the passivation layer comprises silicon dioxide.

37. The apparatus of claim 35 wherein the passivation layer comprises silicon nitride.

38. The apparatus of claim 26 wherein the first insulating layer comprises benzocyclobutene.

39. The apparatus of claim 26 wherein the first conducting means comprises a conducting metal layer.

40. The apparatus of claim 39 wherein the conducting metal layer comprises copper, titanium and nichrome.

41. The apparatus of claim 26 wherein the second insulating layer comprises benzocyclobutene.

42. The apparatus of claim 26 wherein the second conducting means comprises a conducting metal layer.

43. The apparatus of claim 42 wherein the conducting metal layer comprises copper.

44. The apparatus of claim 26 wherein the conducting external connection means comprises a metal plating layer.

45. The apparatus of claim 44 wherein the metal plating layer comprises copper.

46. The apparatus of claim 44 wherein the metal plating layer comprises nickel.

* * * * *